United States Patent
Hannum et al.

(10) Patent No.: US 6,823,434 B1
(45) Date of Patent: Nov. 23, 2004

(54) SYSTEM AND METHOD FOR RESETTING AND INITIALIZING A FULLY ASSOCIATIVE ARRAY TO A KNOWN STATE AT POWER ON OR THROUGH MACHINE SPECIFIC STATE

(75) Inventors: David P Hannum, Fort Collins, CO (US); Rohit Bhatia, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/510,128

(22) Filed: Feb. 21, 2000

(51) Int. Cl.$^7$ .............................................. G06F 12/00

(52) U.S. Cl. ...................... 711/166; 711/128; 711/210; 711/206

(58) Field of Search .......................... 711/128, 133–134, 711/137, 210, 144–145, 159, 166, 205–207, 221, 216, 5, 163, 3, 108; 713/11, 100, 1–2, 200; 712/216–217, 245; 707/9

(56) References Cited

U.S. PATENT DOCUMENTS

| | | | | | |
|---|---|---|---|---|---|
| 4,197,580 A | * | 4/1980 | Chang et al. | ................ | 711/144 |
| 4,493,026 A | * | 1/1985 | Olnowich | .................... | 711/128 |
| 5,809,528 A | * | 9/1998 | Miller et al. | ................. | 711/136 |
| 6,202,204 B1 | * | 3/2001 | Wu et al. | ....................... | 717/9 |
| 6,453,387 B1 | * | 9/2002 | Lozano | ........................ | 711/133 |
| 6,539,541 B1 | * | 3/2003 | Geva | ........................... | 717/150 |

* cited by examiner

Primary Examiner—Denise Tran

(57) ABSTRACT

The present invention relates to a system and method for establishing an illegal system state for a table which is preferably fully associative to disable matching of prospective entries (entries to be written to the table) with entries already resident in the table. Preferably, disabling the matching of prospective and table entries forces a system for updating the fully associative table or array to employ a pointer system for writing prospective entries into the fully associative table. The illegal system may be invoked automatically upon powering up the system for updating the fully associative array or may be associated with a machine specific state effected upon issuing a specific command during program execution.

16 Claims, 2 Drawing Sheets

SYSTEM AND METHOD FOR RESETTING AND INITIALIZING A FULLY ASSOCIATIVE ARRAY TO A KNOWN STATE AT POWER ON OR THROUGH MACHINE SPECIFIC STATE

RELATED APPLICATIONS

Reference is hereby made to concurrently filed, and commonly assigned U.S. patent application Ser. No. 09/510,278 filed Feb. 21, 2000 entitled "MECHANISM FOR DATA FORWARDING", now U.S. Pat. No. 6,707,831; application Ser. No. 09/510,288, filed Feb. 21, 2000, entitled "SYSTEM AND METHOD FOR EFFICIENTLY UPDATING A FULLY ASSOCIATIVE ARRAY"; and application Ser. No. 09/510,282, filed Feb. 21, 2000, now issued U.S. Pat. No. 6,618,803, entitled "SYSTEM AND METHOD FOR FINDING AND VALIDATING THE MOST RECENT ADVANCE LOAD FOR A GIVEN CHECK LOAD" which disclosures are incorporated herein by reference.

TECHNICAL FIELD

This invention relates generally to the generation of an initialized state for a fully associative array and more particularly to the generation of an illegal state for such a fully associative array.

BACKGROUND

It is generally desirable to reorder selected instructions in a computer program to improve program execution efficiency. One form of such reordering is that of moving or speculating instructions which load data from certain memory locations as well as instructions which may use the data received in the load instructions with respect to store instructions. A hazard associated with such reordering may exist where a store instruction, which succeeds the speculated load instructions and instructions using loaded data ("use" instructions), accesses the same memory location as one or more speculated load instructions. In this case, the speculation will generally have had the effect placing incorrect data into registers accessed by the speculated instructions. Where such a conflict occurs, execution of the load instruction and any "use" instructions (instructions using the loaded data) will be invalidated and undone. Recovery will generally be executed which may include canceling, re-fetching, and re-executing the instructions rendered invalid by the conflict with the store operation.

One prior art approach to responding to such a conflict arising from a speculation is to allow the store instruction which conflicts with the speculated load instruction to become the oldest instruction in a pipeline and retire, while instructions after the store are canceled, re-fetched, and re-executed once the store instruction has been committed to a cache or memory hierarchy.

One problem arising in the prior art is that there is generally no software control over the storing, loading, and reordering operations at run-time. Another problem is that the use of hardware imposes limitations on the instruction window size, thereby limiting the available code optimizations. Furthermore, there is a generally a large recovery penalty in the prior art, where the extent of such penalty generally depends upon the way in which the hardware implements the optimization process.

Therefore, it is a problem in the art that hardware optimization implementations must generally perform optimizations within a limited instruction window size.

It is a further problem in the art that a large recovery penalty results in a hardware controlled optimization process.

It is a still further problem in the art that there is there is generally no software control over the storing, loading, and re-ordering operations at run-time.

SUMMARY OF THE INVENTION

These and other objects, features and technical advantages are achieved by a system and method which splits original load instructions into advanced load instructions and check instructions. The advanced load instructions are preferably placed in a more advanced location in a code sequence than corresponding original load instructions and operate to load data. Each check instruction preferably operates to check the validity of advanced load instructions employing a particular register, identifies the most recent advanced load instruction employing that register, and validates the identified most recent advanced load instruction by comparing it to store instruction address information pending in an instruction queue or pipeline. Where no match is found with store instruction address information, the speculation is preferably considered to have succeeded, thereby indicating that the placement of the advanced load instruction did not conflict with any store instruction and that the speculation of this advanced load instruction was therefore successful. Generally, upon splitting an original load instruction, as mentioned above, an advanced load instruction corresponding to the original load instruction is placed before a selected store instruction, and a check instruction corresponding to the original load instruction is kept in the location of the original load instruction in an optimized code sequence.

Identification of the most recent advanced load instruction and validation of this advanced load instruction against store address information are preferably accomplished independently and in parallel, thereby preferably improving overall cycle time and effecting transmission of conflict information (the "hit" or "miss" status of a comparison with store address information) to an exception handling unit early enough to initiate recovery.

Preferably, one or more tables are employed for storing information associated with advanced load instructions. The tables employed for this purpose are preferably fully associative, thereby enabling comparisons of one datum such as a store instruction memory address with any data entry stored in the table. Fully associative tables also preferably enable register numbers and memory addresses to be stored anywhere in the table, thereby obviating a need to index the table according to register number. In a preferred embodiment, data preserved in association with an advanced load instruction may include the register number to which an instruction loaded data, the memory address from which the data was loaded, and a log of the validity status of the advanced load instruction. Such information may be kept in a single table, or stored in corresponding locations in a plurality of separate tables.

In a preferred embodiment, a fully associative table is deployed which includes a plurality of data banks and a plurality of ports able to write to the plurality of data banks, or "banks." The inventive mechanism thereby preferably enables simultaneous updates of the table by employing separate ports writing to separate banks in parallel. Such parallel operation preferably operates to enable multiple table updates to be effected during a single machine cycle.

In a preferred embodiment, for each prospective entry at a port, the inventive mechanism employs a set of factors to determine which bank and which entry location within a bank the prospective entry will be written to. Regarding bank selection, the factors generally include whether or not a match exists between the prospective entry and an existing table entry, a default bank connection for the port at which the prospective entry resides, and the operation of randomization logic to substantially equalize data storage among the plurality of banks. Regarding entry location selection, the factors generally include: whether or not a match exists between the prospective entry, a table entry location of a next invalid entry, and a table entry location of a next sequential entry within one bank (in the case where all entries in a bank are valid).

In an preferred embodiment of the present invention, an illegal system state may be invoked wherein illegal value are written to the entries of a fully associative table. These illegal values are preferably not able to match prospective entries during a normal course of program execution. The illegal system state may be invoked upon hardware power-up or reset of a system which includes the fully associative table or by a machine specific state invoked by program execution.

Therefore, it is an advantage of a preferred embodiment of the present invention that an illegal system state may be invoked which preferably disables matching of prospective entries at various ports writing to a fully associative table.

It is a further advantage of a preferred embodiment of the present invention that the generation of an illegal system state is able to ensure repeatability of test cases or program sequences when such cases or programs are run repeatedly on the same hardware.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
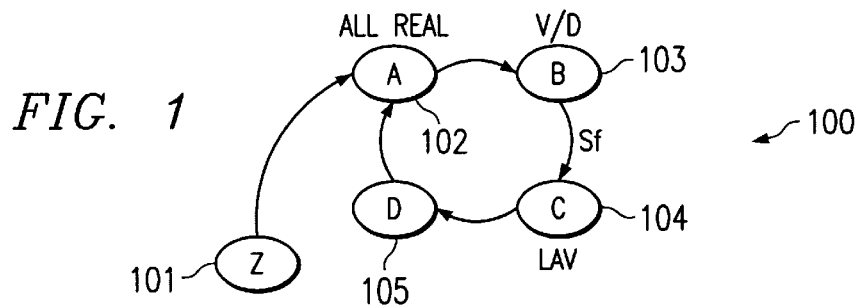
FIG. 1 is a state diagram which includes an illegal state according to a preferred embodiment of the present invention.

FIG. 1 is a state diagram 100 which includes an illegal state 101 according to a preferred embodiment of the present invention.

In a preferred embodiment, a fully associative table structure as is described in incorporated patent application Ser. No. 09/510,282, filed Feb. 21, 2000, now issued U.S. Pat. No. 6,618,803, entitled "SYSTEM AND METHOD FOR FINDING AND VALIDATING THE MOST RECENT ADVANCE LOAD FOR A GIVEN CHECK LOAD," may be cycled through a series of states by software executing in the compiler system. States A 102, B 103, C 104, and D105 preferably represent states which software may cycle a hardware structure (such as the fully associative table) through. States A 102 through D 105 are preferably the only legal states in state diagram 100.

Herein, the term "prospective entry" generally refers to an entry at a port ready to be written to a location in a fully associative table, and the term "table entry" generally refers to an entry already present in a fully associative table. Prospective entries may be directed into a table because of a condition where a prospective entry matches a table entry. Alternatively, prospective entries may be directed into locations in a fully associative table as directed by a pointer which indicates a location of an invalid entry. These alternative mechanisms for writing entries into fully associative tables are further described in incorporated patent application Ser. No. 09/510,288, filed Feb. 21, 2000, entitled "SYSTEM AND METHOD FOR EFFICIENTLY UPDATING A FULLY ASSOCIATIVE ARRAY." Herein, the term "illegal value" generally refers to a value which a prospective entry would preferably not acquire in a normal course of program execution.

In a preferred embodiment of the present invention, illegal state Z 101 is added to the four legal states A 102 through D 105 and is included in the total number of states which fully a associative table may be cycled through. Preferably, state Z 101 cannot be reached during a normal course of program execution, which explains a uni-directional arrow from state Z 101 to state A 102. Preferably, state Z 101 may be reached during a process of turning power on to hardware housing fully associative table or other data storage entity or by executing a machine specific instruction which is preferably specifically intended to generate illegal state Z 101. Generally, a machine specific instruction is a sequence of operations undertaken to achieve a reset which operations access machine-specific storage elements in a system. Preferably, the machine specific instruction achieves substantially the same effect as powering on the system.

In a preferred embodiment, deployment of the added illegal state Z 101 to the available system states of a fully associative table enables repeatability of test cases or program sequences when such test cases or program sequences are repeatedly run on the same hardware. Preferably, disabling the matching of prospective entries on ports able to write to the fully associative table reduces the variation in behavior of programs on successive execution runs employing the same hardware. Preferably, the number of sources of error is reduced by disabling the ability to match prospective entries and table entries, thereby advantageously simplifying a debugging process.

Figure 2:
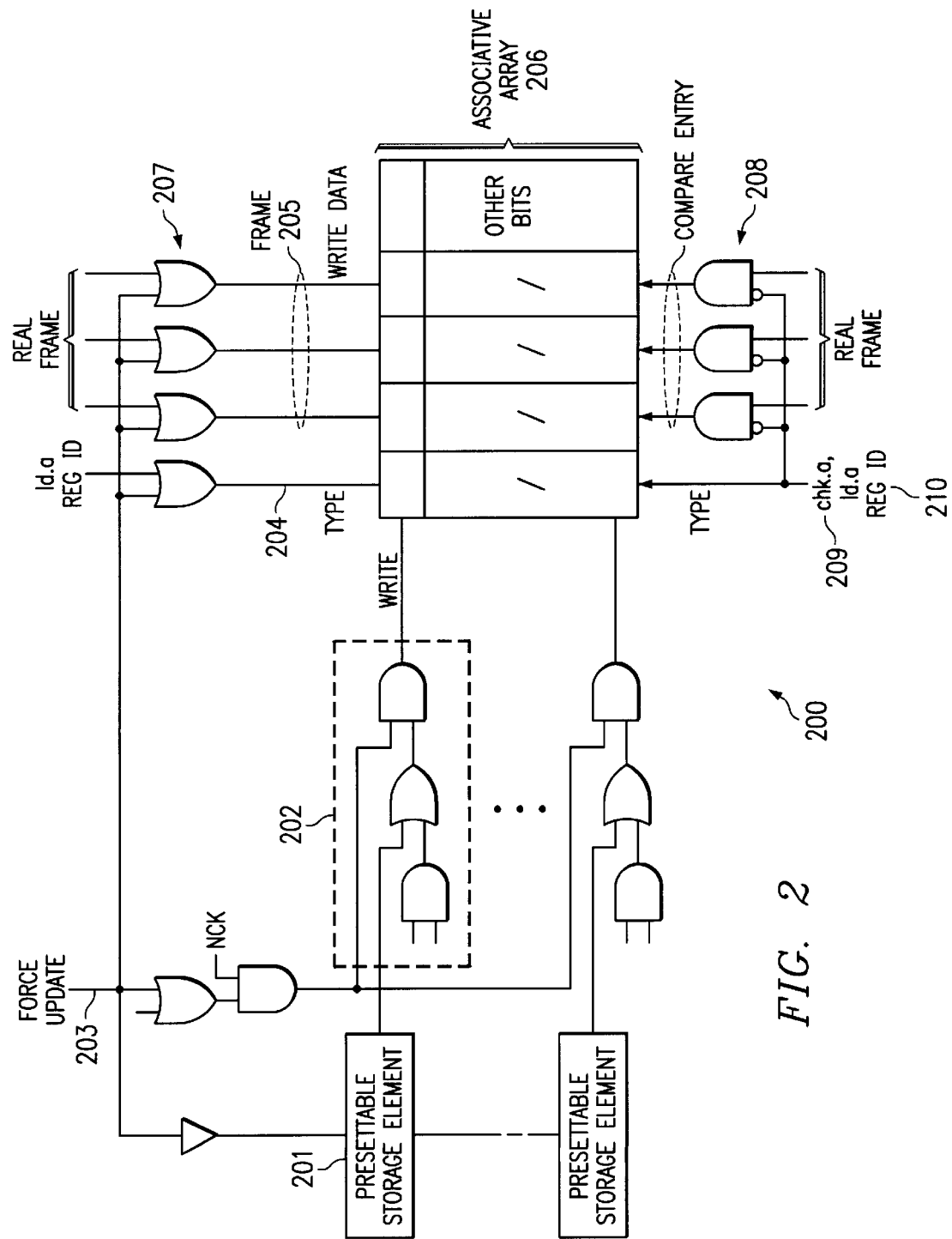
FIG. 2 depicts a hardware structure for writing illegal values to entries in an associative array according to a preferred embodiment of the present invention.

FIG. 2 depicts a hardware structure for writing illegal values to entries in associative array 206 according to a preferred embodiment of the present invention. It will be appreciated that other hardware structures, software designs, and/or combinations of the two may be employed to implement the provision of an illegal state of associative table or array 206, and all such variations are included within the scope of the present invention.

In a preferred embodiment, illegal state Z 101 (FIG. 1) is implemented by writing illegal values to all entries in associative array 206. By writing illegal values to all entries in associative table 206, matches with prospective entries are thereby preferably disabled, since prospective entries are preferably unable to acquire illegal values during a normal course of program execution. Preferably, the same illegal value is written to all entries in associative table or array 206. However, in an alternative embodiment, a plurality of different illegal values may be written to different entries, and all such variations are included within the scope of the present invention.

In a preferred embodiment, creating an illegal entry in associative array 206 generally involves synthesizing a bit sequence which no prospective entry will match during a normal course of program execution. One exemplary mechanism for creating such a bit sequence includes establishing a combination of "type" and "frame" bits which will not be matched by prospective entries. Register numbers or identifications generally include one type bit and one or more frame bits. Preferably, where the type bit has a value of 1, the frame bits, however many there are, preferably all have a value of 0. Generally, where the type bit has a value of 0, the frame bits may have any value.

In a preferred embodiment, in order to achieve a combination of type and frame bits not available in the normal course of program execution, an illegal entry may include a type bit having a value of 1, and frame bits which are all set to a value of 1. The stated combination of type and frame bits (where type bit and all frame bits all equal 1) will generally not be present in a legal prospective entry. Accordingly, ensuring that all entries in associative table 206 include the "illegal" combination of a type bit equal to 1, and all frame bits being equal to 1, will generally disable any possible matching of prospective entries with table entries which are set to the above-described illegal state. It will be appreciated that the particular combination of type bits and frame bits discussed above represents but one embodiment of an entry value which would not be matched by any prospective entry in the normal course of program execution. Numerous other mechanisms for establishing writing values to all table 206 entries which cannot be matched with prospective entries may be implemented, and all such variations are included within the scope of the present invention. For example, one alternative may involve establishing a flag bit which is always 0 for both table entries and prospective entries in the normal course of program execution, but which is set to 1 to indicate an illegal or "no-match" status.

In a preferred embodiment, where table 206 is in an illegal state, this illegal state causes a mechanism for writing entries into table 206 to forego writing prospective entries to table locations containing matching values in favor of writing entries according to a pointer update mechanism described in incorporated patent application Ser. No. 09/510,288, filed Feb. 21, 2000, now U.S. Pat. No. 6,618,803, entitled "SYSTEM AND METHOD FOR EFFICIENTLY UPDATING A FULLY ASSOCIATIVE ARRAY," hereinafter referred to as the "P141 application."

In a preferred embodiment, a force update command 203, which may result from either a power-on condition or machine specific instruction, causes latch or presettable storage element 201 to acquire a value of 1 and causes a selected bit value to be written to an entry in array 206. Preferably, this process is performed for all entries in the array 206, thereby causing all entries in array 206 to store an illegal value and place array 206 as a whole in an illegal state. The "illegal values" written to the entries in array 206 are preferably as described above with regard to the value of the "type" and "frame" bits. Once the described illegal values (i.e. type bit=1 and all frame bits=1) are in the entries in array 206, the table entries preferably cannot match any check or advanced load instruction values arriving at array 206 as prospective entries.

In a preferred embodiment, initialization to the illegal state is effected employing OR gates 207 leading to the writing of type data 204 and frame data 205 into array 206. Preferably, the comparing of prospective entries for matches according to conventional operation of array 206 is accomplished employing logic structure 208.

In a preferred embodiment, a first check instruction 209 is compared with the entries in array 206 to look for entries matching check instruction 209. However, since array 206 has preferably been set to an illegal state, check instruction 209 generally will not match any entry in array 206. Likewise, the absence of a match between ld.a instruction 210 and any entry in table 206 will generally cause advanced load instruction 210 (written as "ld.a" in FIG. 2) to update array 206 employing a pointer mechanism described in the incorporated P141 application. Preferably when array 206 is in an illegal state, there will not be any accidental matches between prospective entries at ports writing to array 206 and entries in array 206. Preferably, there is one logic structure 208 for each of the check instructions 209 and the advanced load instructions 210.

It will be appreciated that FIG. 2 depicts but one of many hardware designs which may be employed to implement the present invention. Numerous alternative hardware configurations, logic gate sequences, software implementations, and/or combinations of the foregoing may be employed to achieve a same or similar result, and all such variations are included within the scope of the present invention.

Figure 3:
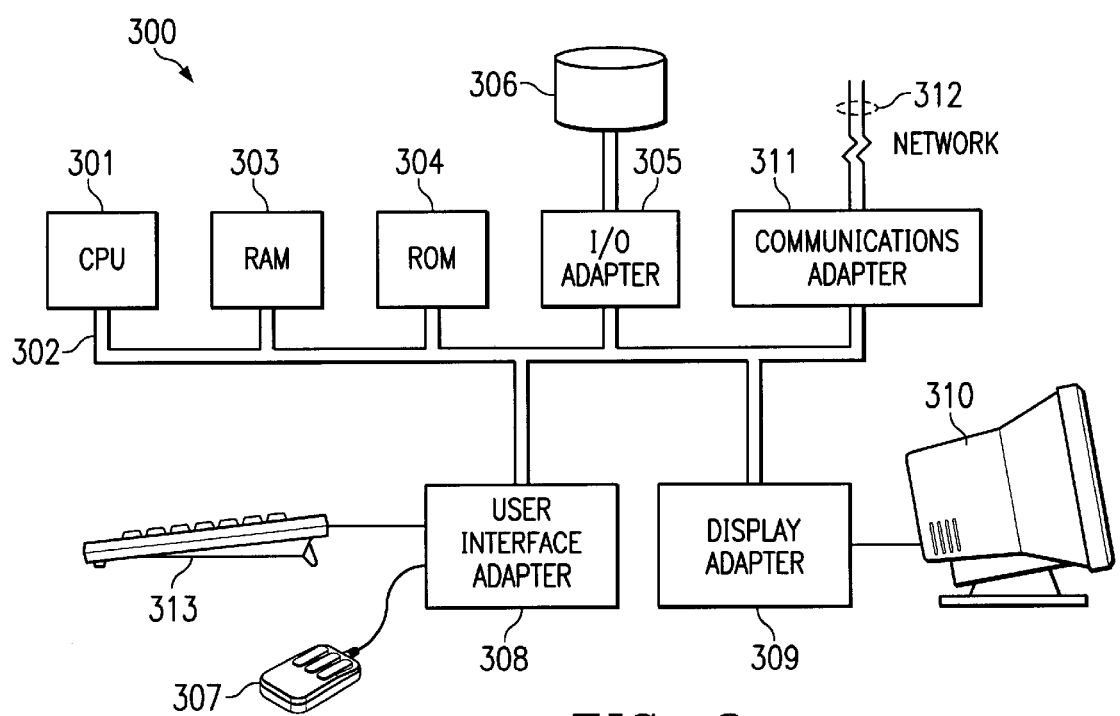
FIG. 3 depicts computer apparatus adaptable for use with a preferred embodiment of the present invention.

FIG. 3 illustrates computer system 300 adaptable for use with a preferred embodiment of the present invention. Central processing unit (CPU) 301 is coupled to system bus 302. The CPU 301 may be any general purpose CPU, such as an HP PA-8200. However, the present invention is not restricted by the architecture of CPU 301 as long as CPU 301 supports the inventive operations as described herein. Bus 302 is coupled to random access memory (RAM) 303, which may be SRAM, DRAM, or SDRAM. ROM 304 is also coupled to bus 302, which may be PROM, EPROM, or EEPROM. RAM 303 and ROM 304 hold user and system data and programs as is well known in the art.

The bus 302 is also coupled to input/output (I/O) adapter 305, communications adapter card 311, user interface adapter 308, and display adapter 309. The I/O adapter 305 connects to storage devices 306, such as one or more of hard drive, CD drive, floppy disk drive, tape drive, to the computer system. Communications adapter 311 is adapted to couple the computer system 300 to a network 312, which may be one or more of local (LAN), wide-area (WAN), Ethernet or Internet network. User interface adapter 308 couples user input devices, such as keyboard 313 and pointing device 307, to the computer system 300. The display adapter 309 is driven by CPU 301 to control the display on display device 310.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for preventing matching of prospective entries with table entries stored in a fully associative table, the method comprising the steps of:

writing illegal values to substantially all of said table entries in said fully associative table; and prohibiting said prospective entries from having said illegal values under normal program execution conditions, thereby preventing any matching conditions between said table entries and said prospective entries;

wherein said writing step comprises the steps of:

setting at least one type bit to 1; and setting all of a set of frame bits to 1.

2. The method of claim 1 wherein said writing step is performed during power up of a system.

3. The method of claim 1 wherein said writing step is initiated by executing a specific machine specific instruction.

4. The method of claim 1 wherein said set of frame bits comprises three frame bits.

5. The method of claim 1 wherein said fully associative table is included in a system for finding and validating a most recent advanced load instruction for a given check instruction.

6. The method of claim 1 comprising the further step of:

updating entries in a fully associative table employing a pointer to indicate a first table location containing an invalid entry.

7. The method of claim 1 comprising the further step of:

storing memory addresses in said fully associative table.

8. The method of claim 1 comprising the further step of:

storing register numbers in said fully associative table.

9. The method of claim 1 wherein said writing step comprises the step of:

issuing a force update command, thereby causing a plurality of presettable storage elements in said fully associative table to acquire a predetermined illegal value.

10. A system for preventing matching of prospective entries with table entries stored in a fully associative table, the system comprising:

means for writing illegal values to substantially all of said table entries in said fully associative table, comprising means for setting at least one type bit to 1, and means for setting all of a set of frame bits to 1; and means for prohibiting said prospective entries from having said illegal values, thereby preventing any matching conditions between said table entries and said prospective entries.

11. The system of claim 10 wherein said writing means operates during power up of a system.

12. The system of claim 10 wherein said writing means is activated by executing a specific machine specific instruction.

13. The system of claim 10 wherein said set of frame bits comprises three frame bits.

14. The system of claim 10 wherein said fully associative table is included in a system for finding and validating a most recent advanced load instruction for a given check instruction.

15. The system of claim 10 further comprising:

means for updating entries in a fully associative table employing a pointer to indicate a first table location containing an invalid entry.

16. The system of claim 10 further comprising:

means for storing memory addresses in said fully associative table.

* * * * *